_United States Patent_ [19]

Sevenhans et al.

[11] Patent Number: 4,888,559
[45] Date of Patent: Dec. 19, 1989

[54] CORRECTION ARRANGEMENT FOR AN AMPLIFIER

[75] Inventors: Joannes M. J. Sevenhans, Brasschaat; Dirk H. L. C. Rabaey, Wijnegem, both of Belgium

[73] Assignee: Alcatel N.V., Amsterdam, Netherlands

[21] Appl. No.: 213,004

[22] Filed: Jun. 29, 1988

[30] Foreign Application Priority Data

Jun. 30, 1987 [BE] Belgium .............................. 8700735

[51] Int. Cl.$^4$ ............................................. H03F 3/45
[52] U.S. Cl. ................................... 330/253; 330/255; 330/257; 330/259; 330/264; 330/265
[58] Field of Search ............... 330/253, 255, 257, 259, 330/264, 265, 270, 268, 274

[56] References Cited

U.S. PATENT DOCUMENTS 4,502,020  2/1985  Nelson et al. ....................... 330/265
4,730,168  3/1988  Senderowicz et al. ......... 330/259 X

FOREIGN PATENT DOCUMENTS 8806379  8/1988  Int'l Pat. Institute .

Primary Examiner—James B. Mullins
Attorney, Agent, or Firm—Christie, Parker & Hale

[57] ABSTRACT

An amplifier includes two differential amplifiers which are connected to an output stage comprising two field effect transistors of opposite conductivity typed directly coupled in series between opposite poles of a DC voltage source. The junction between the two output transistors constitutes the output of the amplifier. A negative feedback loop connects the amplifier's output to the inputs of the differential amplifiers. A correction arrangement is provided to prevent excessive current consumption and cross-over distortion. Preferably, the correction arrangement uses a pair of current mirror circuits to generate respective measuring currents proportional to the current in each of the output transistors. Each such measuring current is compared with a reference current. Any difference between the measuring current and the reference current causes a change in the voltage on the control electrode of the other output transistor, which in turn results in a change in the output voltage and thus a change in the negative feedback applied to both differential amplifiers.

11 Claims, 2 Drawing Sheets

CORRECTION ARRANGEMENT FOR AN AMPLIFIER

TECHNICAL FIELD

CLAIM FOR PRIORITY

This application is based on and claims priority from an application first filed in Belguim on 30 June 1987 under serial number 8700735. To the extent such prior application may contain any addition information that might be of any assistance in the use and understanding of the invention claimed herein, it is hereby incorporated by reference.

BACKGROUND ART

The present invention relates to a correction arrangement for an amplifier which includes two An amplifier correction arrangement which includes two differential amplifiers whose outputs are coupled to the control electrodes of respective output transistors of opposite conductivity type which constitute an output stage and are coupled in series between the poles of a DC voltage source and the junction point of which constitute the output of the amplifier
is already known from the Belgian patent no. 8700160 (D. Haspelagh et al 3-4-6). This known correction arrangement prevents excessive current consumption and cross-over distortion of the amplifier and is constituted by a series circuit connected across the output stage which includes a first current source, an impedance and a second current source, the junction points of the current sources and the impedance being directly coupled with the control electrodes of respective output transistors. The correcting operation of this known arrangement consists in maintaining the voltage drop over the impedance substantially constant. However, it is clear that when the impedance is modified the correction operation is also influenced. This may for instance happen when the diode connected MOS transistor which is used as the impedance is replaced by a MOS transistor having another threshold voltage. Transistors may have different threshold voltages when they are for instance manufactured according to different processes. This means that the correction effect of the known circuit is to a certain extent process dependent.

DISCLOSURE OF INVENTION

An object of the present invention is to provide a correction arrangement of the above type, but which does not present this drawback.

This object is achieved by including at least one correction circuit provided (a) with measuring means for measuring the DC current through one of the output transistors and for providing a measuring DC current which is a measure of this measured DC current and (b) with means for comparing this measuring DC current with a reference DC current and for changing the DC voltage on the control electrode of the other output transistor as a function of the thus obtained difference DC current and for producing a correction operation on the amplifier via a negative feedback arrangement connecting the amplifier output to the inputs of the two differential amplifier stages.

Other characteristics of the improved correction arrangement are that the measuring means is coupled to said output transistor and produces said measuring DC current in a measuring transistor and that the series connection of said measuring transistor and a constant current source providing said reference DC current is connected in parallel across said output stage, the junction point of said measuring transistor and said constant current source which together constitute said comparison means being directly connected to the control electrode of said other output transistor Still another characteristic of the present correction arrangement is that the nominal value of the measuring DC current is equal to said reference DC current.

In the absence of an input signal the difference DC current is zero and the DC voltage on the control electrode of the other output transistor is not influenced. However, when the measured DC current deviates from its nominal value a regulating operation is performed which is only a function of the measured difference DC current and independent from the deviation which gave rise to this difference DC current. This means that this deviation may be the result either of an offset of the differential amplifier or of a modified threshold voltage of e.g. an output transistor.

BRIEF DESCRIPTION OF DRAWINGS

The above mentioned and other objects and features of the invention will become more apparent and the invention itself will be best understood by referring to the following description of an embodiment taken in conjunction with the accompanying drawings wherein.

BEST MODE FOR CARRYING OUT THE INVENTION

Figure 1:
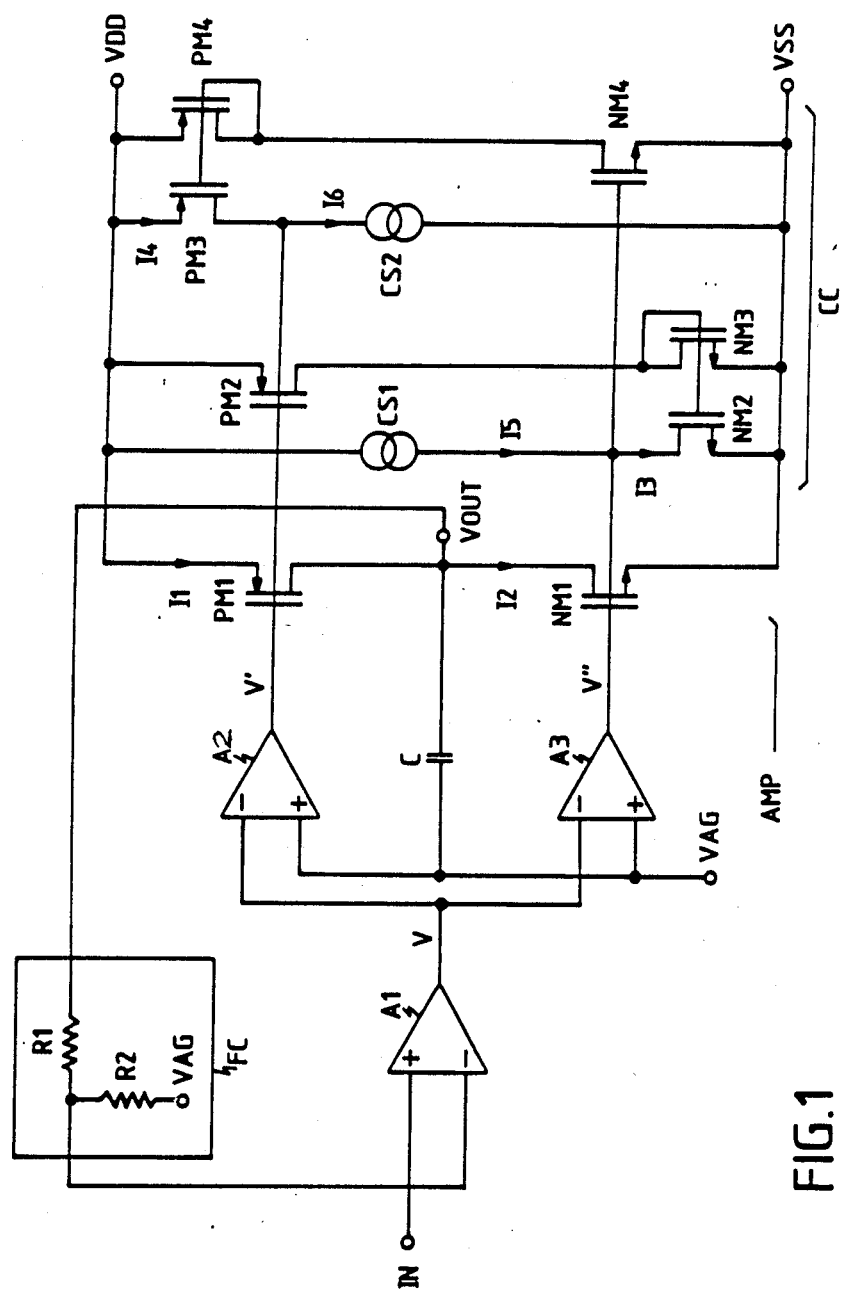
FIG. 1 represents an amplifier and an associated correction arrangement according to the invention.

The circuit represented in FIG. 1 operates with the supply voltages VDD=5 Volts; VSS=0 Volt and VAG=2.5 volts and includes a class AB amplifier AMP and an associated correction arrangement CC. The amplifier AMP includes an input stage differential amplifier A1 whose plus input constitutes the input IN of the amplifier and whose output V is connected to the minus inputs of two differential amplifiers A2 and A3. Together these amplifiers constitute an intermediate stage and their plus inputs are connected to the voltage VAG. The intermediate stage differential amplifiers A2 and A3 are used for amplifying the positively and negatively directed input signals respectively. The outputs V' and V'' of these amplifiers A2 and A3 are connected to the gate electrode of PMOS transistor PM1 and NMOS transistor NM1 respectively, the source-to-drain path of PM1 and the drain-to-source path of NM1 being connected in series between the DC supply voltages VDD and VSS. The transistors PM1 and NM1 together form the class AB output stage of the amplifier and their junction point is the output VOUT thereof. This output is coupled back, on the one hand to the plus inputs of A2 and A3 via a compensation capacitor C and, on the other hand, to the minus input of A1 via a negative feedback circuit FC. The latter is constituted by a voltage divider comprising a series resistance R1 and a shunt resistance R2 connected to VAG.

The correction arrangement CC includes two similar correction circuits which include a constant current source CS1; CS2 and MOS transistors PM2, NM2, NM3; NM4, PM3, PM4, respectively.

The constant current source CS1 and NMOS transistor NM2 form a series circuit which is connected across the output stage PM1, NM1. The output transistor PM1 is connected in current mirror configuration with NMOS measuring transistor NM2 via PMOS transistor PM2 and the diode connected NMOS transistor NM3. The dimensions of PM1/2 and NM2/3 are so chosen that the DC current I3 which is thus obtained in NM2 by mirroring of the DC current I1 in PMI, is equal to KI1, with e.g. k =1/20. The constant DC reference current which is provided by CS1 is designated 15.

In a similar way the series connection of PMOS measuring transistor PM3 and constant current source CS2 is connected in parallel across the output stage. The output transistor NM1 is connected in current mirror configuration with PMOS transistor PM3 via NMOS transistor NM4 and the diode connected PMOS transistor PM4. The DC current I4 in PM3 obtained by mirroring the DC current I2 in NM1, via NM4 and PM4, is for instance equal to k'I2, with k' =1/20. The constant reference DC current which is provided by CS2 is designated I6.

As will become clear later each correction circuit CS1, PM2, NM3/2, CS2, NM4, PM4/3 includes:

measuring means PM2, NM3, NM2 and NM4, PM4, PM3 for measuring the current I1; I2 and for generating in the measuring transistor NM2; PM3 a measuring DC current I3; I4 which is a measure of this measured DC current I1; I2;

control means CS1, NM2 and PM3, CS2 for comparing the measuring DC current I3; I4 with the DC reference DC current I5; I6 and for modifying the gate DC voltage V'''; V' as a function of the thus obtained difference DC current, due to which a correction operation is then performed via the feedback circuit FC.

It should be noted that two correction circuits are provided in order that the current I1 should be corrected in the same way as the current I2 and vice versa. However, a correction operation is performed by each such correction circuit.

Figure 3:
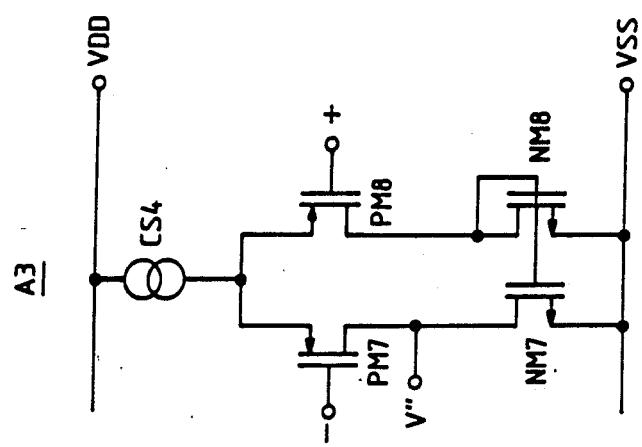
FIGS. 2 and 3 represent the intermediate stage differential amplifiers A2 and A3 of FIG. 1 in more detail.
Figure 2:
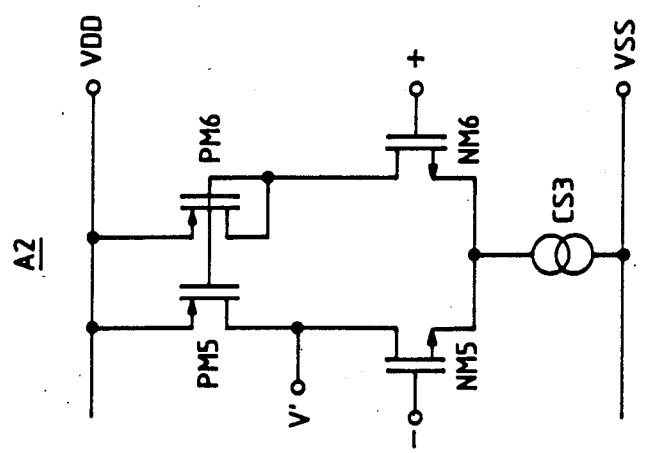

The intermediate stage differential amplifiers A2 and A3 are shown in detail in FIG. 2 and FIG. 3 respectively.

The intermediate stage differential amplifier A2 includes two input transistors NM5 and NM6 whose gates constitute the minus and plus input of the amplifier. The source-to-drain paths of two PMOS transistors PM5 and PM6 which are branched in current mirror configuration are connected in series with the drain-to-source paths of NM5 and NM6 respectively and a common constant current source CS3. The junction point of PM5 and NM5 constitutes the output V' of A2.

The intermediate stage differential amplifier A3 is similar to A2 and includes PMOS transistor PM7/8, NMOS transistors NM7/8 and constant current source CS4. The gates of PM7 and PM8 are the minus and plus inputs of A3 respectively and the junction point of PM7 and NM6 constitutes the output terminal V'' of A3.

Both correction circuits of the correction arrangement operate in a similar way and for this reason only the operation of correction circuit CS1, PM2, NM3/2 is described.

In the rest condition of the circuit, i.e. in the absence of an input signal, and under normal circumstances equal currents I1 and I2 flow in PM1 and NM1 respectively and VOUT=0. The measuring DC current I3 mirrored in measuring transistor NM2 by transistors PM2 and NM3 is then equal to the reference DC current I5 of the constant current source CS1 so that the gate DC voltage V'' is then not influenced by the correction circuit CC. This means that in the amplifier A3 the current of PM7 completely flows through NM7.

It is now assumed that in the rest condition of the circuit the DC current I1 though PM1 is too large so that an excessive current consumption could be produced. This is for instance the result of an offset producing a too small output voltage V' of A2 or gate voltage V' of PM1. For this reason the current I3 mirrored in the measuring transistor NM2 by the measuring means PM2, NM3, NM2 is too large, as a consequence of which the current balance at the junction point V'' of CS1 and NM2 is broken. The additional difference DC current dI3=I3-I5 flowing through NM2 has therefore to be produced by the amplifier A3. As a consequence a decrease is produced in the output DC voltage V'' of this amplifier A3 and therefore in the gate DC voltage V'' of transistor NM1. The current I2 through NM1 thereby decreases and this leads in its turn to an increase of the output voltage VOUT. As a consequence the feedback circuit FC, the amplifier A1 and the differential amplifiers A2 and A3 produce an increase of the output voltages V' and V'' of A2 and A3. This gives rise to a decrease of I1 and an increase of I2 and this in turn results in a decrease of VOUT. An equilibrium is reached when the current balance in point V'' is restored, i.e. when dI3=0. In this case VOUT will also again be zero.

It is clear that a too small current I1 which could produce cross-over distortion is corrected in a similar way until the current balance at point V' is also restored.

While the principles of the invention have been described above in connection with specific apparatus, it is to be clearly understood that this description is made only by way of example and not as a limitation on the scope of the invention.

We claim:

1. An amplifier comprising:
    a DC voltage source having first and second poles;
    an output stage comprising two output field effect transistors of opposite conductivity type which are each directly coupled in series between a common output junction point and a respective one of said first and second poles, the common output junction point constituting an amplifier output;
    two differential amplifiers each having a respective output coupled to a control electrode of a respective one of said output transistors, and
    a correction arrangement including at least one correction circuit comprising:
        a current mirror circuit including a third field effect transistor having a control electrode directly coupled to the control electrode of one of the output field effect transistors for providing a first measuring current which is proportional to the DC current through said one output transistor;
        control means responsive to said first measuring current and to a reference current for changing the DC voltage on the control electrode of the other output field effect transistor as a function of the difference between said first measuring current and said reference current, and
        negative feedback means for connecting said amplifier output to respective inputs of the two differential amplifiers.

2. An amplifier comprising a correction arrangement in accordance with claim 1, wherein:

said control means further comprises
  diode means in series with said third field effect transistor for producing a control voltage proportional to said first measuring current;
  a measuring transistor responsive to said control voltage for producing a second measuring current proportional to said first measuring current, and
  a constant current source which provides said reference current;
  said measuring transistor is coupled in series with said constant current source;
  said measuring transistor and said constant current source is connected in parallel across said output stage; and
  a junction point of said measuring transistor and said constant current source is directly connected to the control electrode of said other output transistor.

3. An amplifier comprising a correction arrangement in accordance with claim 2, wherein:
  both said second measuring current and said reference current are DC currents and
  the nominal value of said second measuring current is equal to said reference current.

4. An amplifier comprising a correction arrangement in accordance with claim 2, wherein said current mirror circuit couples said one output transistor with said measuring transistor.

5. An amplifier comprising a correction arrangement in accordance with claim 1, wherein said correction arrangement includes two of said correction circuits which are each able to measure the DC current in a respective output transistor and to change the DC voltage on the control electrode of the respective other output transistor as a function thereof and to thus perform a correcting operation via said feeback means.

6. An amplifier comprising a correction arrangement in accordance with claim 1, wherein said feedback means further comprises
  a feedback circuit and
  an input stage differential amplifier having a plus input constituting an input of the amplifier, a minus input with which said amplifier output is connected via said feedback circuit and an output coupled to the inputs of the two differential amplifiers.

7. An amplifier comprising a correction arrangement in accordance with claim 6, wherein
  the minus inputs of said differential amplifiers are connected to the output of the input stage differential amplifier and
  the plus outputs of said differential amplifiers are connected to a common DC voltage.

8. An amplifier comprising a correction arrangement in accordance with claim 7, wherein said common DC voltage is equal to (VSS = VDD)/2, VSS and VDD being the DC volages of said poles.

9. An amplifier comprising a correction arrangement in accordance with claim 1, wherein
  each of said two differential amplifiers comprises two input transistors whose gates constitute the inputs, two other transistors mutually connected in current mirror configuration, the source-to-drain path of each of said two input transistors is connected in series with the source-to-drain path of a respective one of said two other transistors, a junction point of the drain electrodes of one of said two input transistors and one of said other transistors constituting the output of the differential amplifier, and
  a common constant current source which is coupled with the source electrodes of said two input transistors.

10. An amplifier comprising a correction arrangement in accordance with claim 9, wherein said transistors are MOS transistors.

11. An amplifier comprising a correction arrangement in accordance with claim 1, wherein said amplifier is a class AB amplifier.

* * * * *

UNITED STATES PATENT AND TRADEMARK OFFICE
CERTIFICATE OF CORRECTION

PATENT NO. : 4,888,559

DATED : December 19, 1989

INVENTOR(S) : J.M.J. Sevenhans; D.H.L.C. Rabaey

It is certified that error appears in the above-identified patent and that said Letters Patent is hereby corrected as shown below:

Column 1, line 17, 18, delete "which includes two An amplifier correction arrangement".
Column 1, lines 24,25, close space between "amplifier" and "is".
Column 2, line 6, after "transistor" insert a period.
Column 3, line 6, change "13" to -- I3 --.
Column 3, line 8, change "KI1" to -- kI1 --.
Column 3, line 9, change "15" to -- I5 --.
Column 3, line 16, change "14" to -- I4 --.
Column 3, line 52, change "transistor" to -- transistors --.

Column 5, line 36, change "feeback" to -- feedback --.
Column 6, line 16, change "=" to -- + --.
Column 6, line 17, change "volages" to -- voltages --.

Signed and Sealed this

Nineteenth Day of November, 1991

*Attest:*

HARRY F. MANBECK, JR.

*Attesting Officer*   *Commissioner of Patents and Trademarks*